(12) United States Patent
Kuroda

(10) Patent No.: US 10,790,019 B2
(45) Date of Patent: Sep. 29, 2020

(54) SEMICONDUCTOR STORAGE DEVICE AND INFORMATION PROCESSING APPARATUS

(71) Applicant: Sony Semiconductor Solutions Corporation, Kanagawa (JP)

(72) Inventor: Masami Kuroda, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/489,148

(22) PCT Filed: Feb. 8, 2018

(86) PCT No.: PCT/JP2018/004279
§ 371 (c)(1),
(2) Date: Aug. 27, 2019

(87) PCT Pub. No.: WO2018/159246
PCT Pub. Date: Sep. 7, 2018

(65) Prior Publication Data
US 2019/0385676 A1 Dec. 19, 2019

(30) Foreign Application Priority Data
Mar. 3, 2017 (JP) ................................. 2017-040738

(51) Int. Cl.
*G11C 13/00* (2006.01)
*G11C 11/16* (2006.01)

(52) U.S. Cl.
CPC ........ *G11C 13/004* (2013.01); *G11C 11/1673* (2013.01); *G11C 11/1675* (2013.01); *G11C 13/0069* (2013.01); *G11C 2013/0054* (2013.01)

(58) Field of Classification Search
None
See application file for complete search history.

(56) References Cited

U.S. PATENT DOCUMENTS 8,031,508 B2 * 10/2011 Toda ...................... G11O 5/063
365/148
2004/0245979 A1 * 12/2004 Ikoma .................... G11C 5/147
323/364

(Continued)

FOREIGN PATENT DOCUMENTS

| JP | 2008-84517 A | 4/2008 |
| JP | 2009-238327 A | 10/2009 |
| JP | 2013-4151 A | 1/2013 |

*Primary Examiner* — Tan T. Nguyen
(74) *Attorney, Agent, or Firm* — Michael Best & Friedrich LLP

(57) ABSTRACT

To provide a novel and improved semiconductor storage device which is capable of implementing a large capacity by enabling normal reading of a value from a storage element. A semiconductor storage device is provided, the semiconductor storage device including: a memory element; a reference element in a first resistance state for generating a reference potential for identifying a value held in the memory element; and a reference element in a second resistance state in which a resistance value of the reference element is higher than that in the first resistance state for generating the reference potential, in which when generating the reference potential, the number of reference elements in the first resistance state is larger than the number of reference elements in the second resistance state.

14 Claims, 13 Drawing Sheets

(56) References Cited

U.S. PATENT DOCUMENTS

| | | | |
|---|---|---|---|
| 2009/0122598 A1* | 5/2009 | Toda | G11C 13/004 |
| | | | 365/158 |
| 2009/0201717 A1* | 8/2009 | Maeda | G11C 11/16 |
| | | | 365/148 |
| 2013/0044534 A1* | 2/2013 | Kawai | H01L 45/08 |
| | | | 365/148 |
| 2019/0088322 A1* | 3/2019 | Pyo | G11C 11/1655 |
| 2019/0130945 A1* | 5/2019 | Hendrickson | G11C 11/1653 |

* cited by examiner

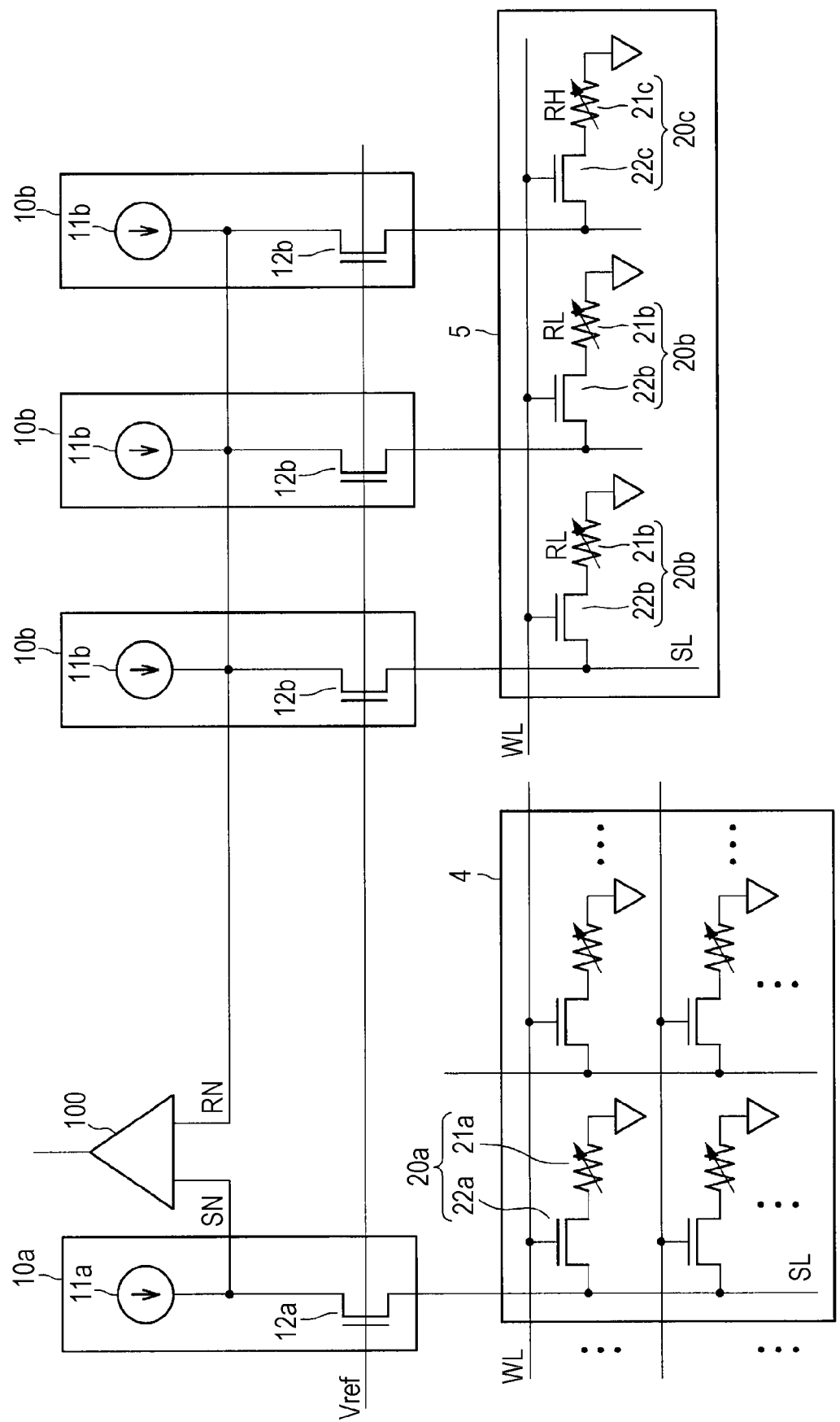

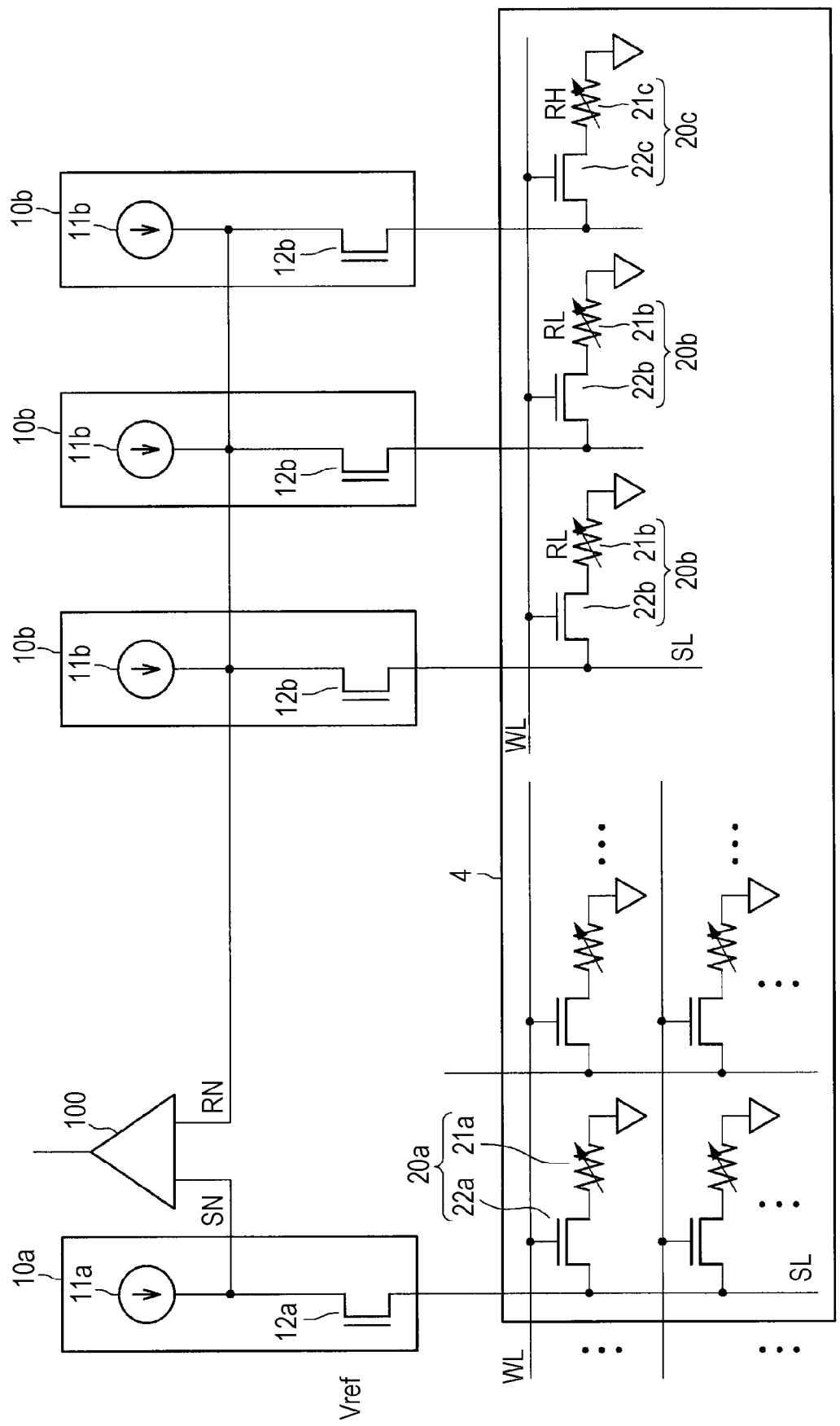

SEMICONDUCTOR STORAGE DEVICE AND INFORMATION PROCESSING APPARATUS

TECHNICAL FIELD

The present disclosure relates to a semiconductor storage device and an information processing apparatus.

BACKGROUND ART

A variable-resistance semiconductor storage device includes a storage element constituted by at least one variable-resistance storage element which stores at least binary information on the basis of an electric resistance value. Further, the variable-resistance semiconductor storage device flows a current to a selected storage element and detects a value of a voltage applied to an electrical resistor of the storage element, by using a sense amplifier, to read a logical value stored in the storage element. In addition, the storage element of the variable-resistance semiconductor storage device has characteristics that when a voltage of a threshold or more is applied, a change to a high resistance or a low resistance occurs according to a direction of the applied voltage. Therefore, the variable-resistance semiconductor storage device requires reading at a voltage no higher than the threshold voltage. There is a need to prepare an intermediate value of two resistance values for identifying a resistance value of the storage element, and for example, a semiconductor storage device in which two storage elements having a high resistance value and a low resistance value, respectively, are arranged in parallel and an average value of the resistance values is obtained has been disclosed (Patent Documents 1 to 3).

CITATION LIST

Patent Document

Patent Document 1: Japanese Patent Application Laid-Open No. 2008-84517
Patent Document 2: Japanese Patent Application Laid-Open No. 2009-238327
Patent Document 3: Japanese Patent Application Laid-Open No. 2013-4151

SUMMARY OF THE INVENTION

Problems to be Solved by the Invention

However, a simple average value of two resistance values is not a median value in consideration of a variation of each of the resistance values and a value cannot be normally read from a storage element in some cases, which hinders implementation of a large capacity.

In this regard, the present disclosure suggests a novel and improved semiconductor storage device which is capable of implementing a large capacity by enabling normal reading of a value from a storage element, and an information processing apparatus.

Solutions to Problems

According to the present disclosure, a semiconductor storage device is provided, the semiconductor storage device including: a memory element; a reference element in a first resistance state for generating a reference potential for identifying a value held in the memory element; and a reference element in a second resistance state in which a resistance value of the reference element is higher than that in the first resistance state for generating the reference potential; in which when generating the reference potential, the number of reference elements in the first resistance state is larger than the number of reference elements in the second resistance state.

Furthermore, according to the present disclosure, an information processing apparatus including at least one semiconductor storage device described above is provided.

Effects of the Invention

As described above, according to the present disclosure, it is possible to provide the novel and improved semiconductor storage device which is capable of implementing a large capacity by enabling normal reading of a value from a storage element, and the information processing apparatus.

Note that effects of the present disclosure are not necessarily limited to the effects described above, and, along with or instead of the effects described above, any of the effects shown in the present specification, or other effects that can be grasped from the present specification may be achieved.

BRIEF DESCRIPTION OF DRAWINGS

FIG. 7 is an explanatory diagram illustrating an example of a circuit configuration of the semiconductor storage device 1 illustrated in FIG. 5.

FIG. 10 is an explanatory diagram illustrating an example of a circuit configuration of the semiconductor storage device 1 according to the embodiment.

MODE FOR CARRYING OUT THE INVENTION

Figure 1:
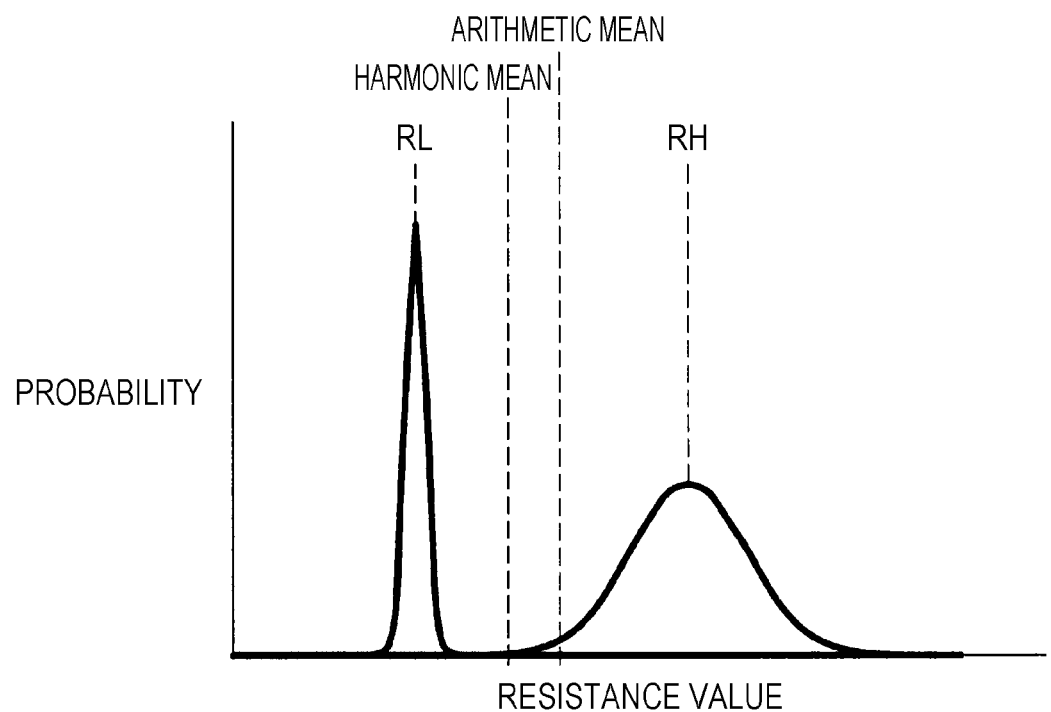
FIG. 1 is an explanatory diagram illustrating an example of a variation of resistance values of two storage elements, the resistance values including a high resistance value and a low resistance value.

Hereinafter, a preferred embodiment of the present disclosure will be described in detail with reference to the accompanying drawings. Note that in the present specification and the drawings, components having substantially the same functional configuration will be denoted by the same reference numerals, and redundant description will be omitted.

Note that descriptions will be provided in the following order.
1. Embodiment of Present Disclosure
1.1. Overview
1.2. Example of Configuration
2. Example of Application
3. Summary 1. Embodiment of Present Disclosure 1.1. Overview Before describing an embodiment of the present disclosure, an overview of the embodiment of the present disclosure will be provided.

As described above, a variable-resistance semiconductor storage device includes a storage element constituted by at least one variable-resistance storage element which stores at least binary information on the basis of an electric resistance value. Further, the variable-resistance semiconductor storage device flows a current to a selected storage element and detects a value of a voltage applied to an electrical resistor of the storage element, by using a sense amplifier, to read a logical value stored in the storage element. In addition, the storage element of the variable-resistance semiconductor storage device has characteristics that when a voltage of a threshold or more is applied, a change to a high resistance or a low resistance occurs according to a direction of the applied voltage. Therefore, the variable-resistance semiconductor storage device requires reading at a voltage no higher than the threshold voltage.

There is a need to prepare an intermediate value of two resistance values in order to identify a resistance value of the storage element. However, in a case where a resistance element for reference having the intermediate value is provided, there is a need to manufacture a resistance element for storage and a resistance element for reference separately, which causes an increase in manufacturing costs. In this regard, a semiconductor storage device, in which, for example, two storage elements having a high resistance value and a low resistance value, respectively, are arranged in parallel and an average value of the resistance values is obtained as an intermediate value of the two resistance values, in order to identify a resistance value of a storage element, has been disclosed.

However, a simple average value obtained from the two storage elements having the high resistance value and the low resistance value is not exactly a median value in consideration of a variation of each of the resistance values in some cases. Due to the fact that the simple average value obtained from the two storage elements having the high resistance value and the low resistance value is not a median value, a possibility that a resistance value of the storage element cannot be accurately read increases, which hinders implementation of a large capacity.

Therefore, in light of the point described above, the present disclosure has diligently studied a technology capable of implementing a large capacity by enabling normal reading of a value from a storage element of a semiconductor storage device. As a result, the present disclosure has come to devise a technology capable of implementing a large capacity by enabling normal reading of a value from a storage element of a semiconductor storage device, as will be described later.

FIG. 1 is an explanatory diagram illustrating an example of a variation of resistance values of two storage elements, the resistance values including a high resistance value and a low resistance value. It is assumed that among two resistance values of variable-resistance storage elements, a high resistance is RH and a low resistance is RL. FIG. 1 illustrates an example of distributions of RH and RL. RL and RH have a relation based on a resistance ratio $\alpha$ as represented by $RH=RL\times(1+\alpha)$. A method for obtaining a reference value RA for separating RL and RH includes a method of taking an arithmetic mean of RL and RH or a method of taking a harmonic mean of the RL and RH. In a case where RL varies according to a normal distribution, a variation around $1\sigma$ in the normal distribution becomes a variation multiplied by $(1+\alpha)$ times for RH, and as a result, the variation of RH becomes wider than that of RL. In other words, it is considered that the method of taking the harmonic mean rather than the method of taking the arithmetic mean is better in terms of identifiability of the resistance value of the storage element.

Figure 2:
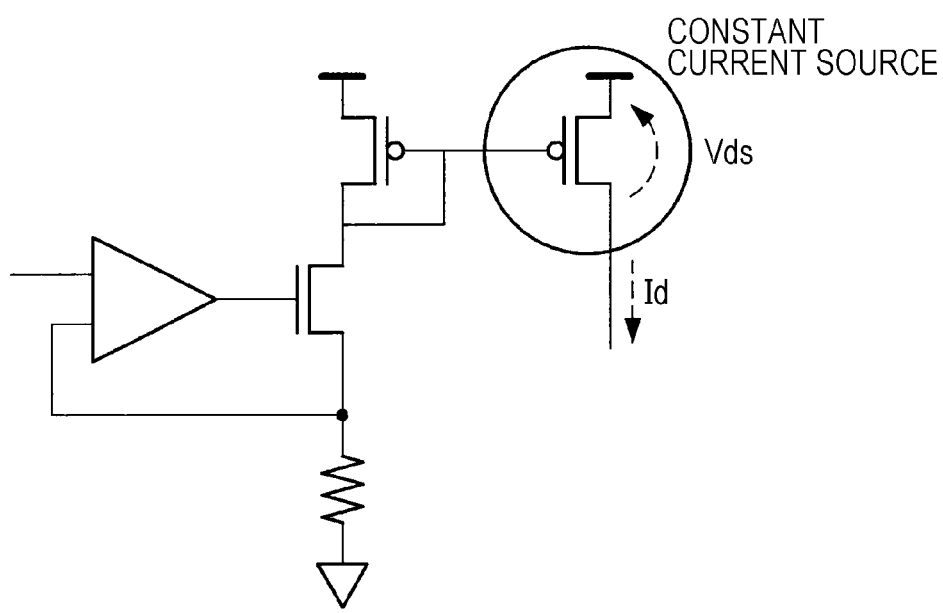
FIG. 2 is an explanatory diagram illustrating an example of a general circuit configuration of a constant current source.
Figure 3:
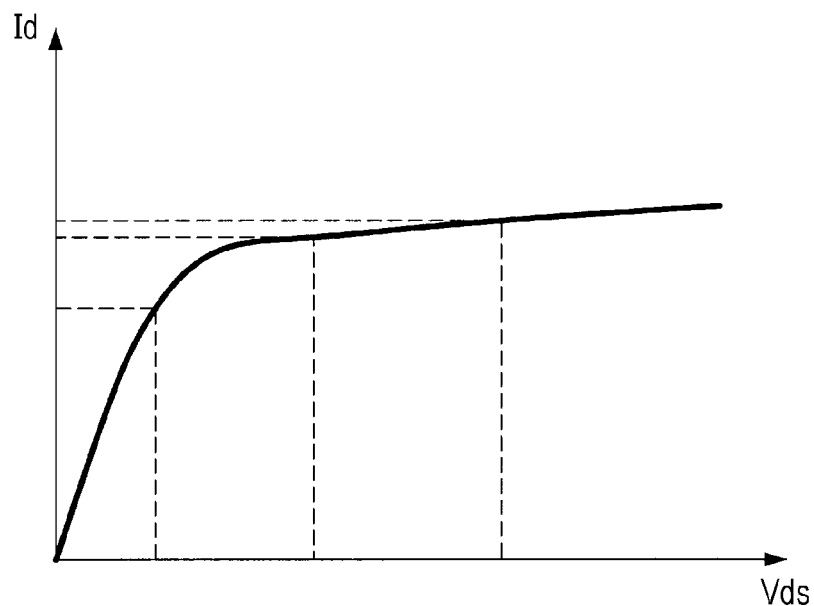
FIG. 3 is an explanatory diagram illustrating a relation between a drain-source voltage and a drain current.

However, the resistance ratio $\alpha$ also varies in practice. Therefore, a lower portion of a distribution curve of RH widens and a low resistance value is required rather than a simple harmonic mean. Furthermore, in general, a current injection type amplifier is connected to the storage element in order to identify a resistance state of the variable-resistance storage element. FIG. 2 is an explanatory diagram illustrating an example of a general circuit configuration of a constant current source and FIG. 3 is an explanatory diagram illustrating a relation between a drain-source voltage Vds and a drain current Id. The constant current source as a constituent element is set so that a change in drain current Id is smaller than a change in drain-source voltage Vds. Therefore, when a storage element with RH having a large $\alpha$ value is connected to the current injection type amplifier, Vds becomes relatively small and a value of a drain current Id of the storage element with RH becomes smaller than that of a drain current Id of a storage element with RL. As a result, an output voltage of the current injection type amplifier becomes lower than an expected value at the time of applying a constant current. Accordingly, in order to obtain an intermediate output level between an output level at the time of connection to the storage element with RL and an output level at the time of connection to the storage element with RH as an actual output of the current injection type amplifier, a resistance even lower than the harmonic mean is required.

In this regard, the semiconductor storage device according to the embodiment of the present disclosure includes a combination of the storage elements with RL and the storage elements with RH so that the number of storage elements with RL is larger than the number of storage elements with RH, when a plurality of storage elements for reference is provided to generate a reference potential. The reference potential is generated with the combination of the storage elements with RL and the storage elements with RH, in which the number of storage elements with RL is larger than the number of storage elements with RH, such that the semiconductor storage device according to the embodiment of the present disclosure can optimize the reference potential and can accurately read a resistance value of a storage element.

1.2. Example of Configuration

Figure 4:
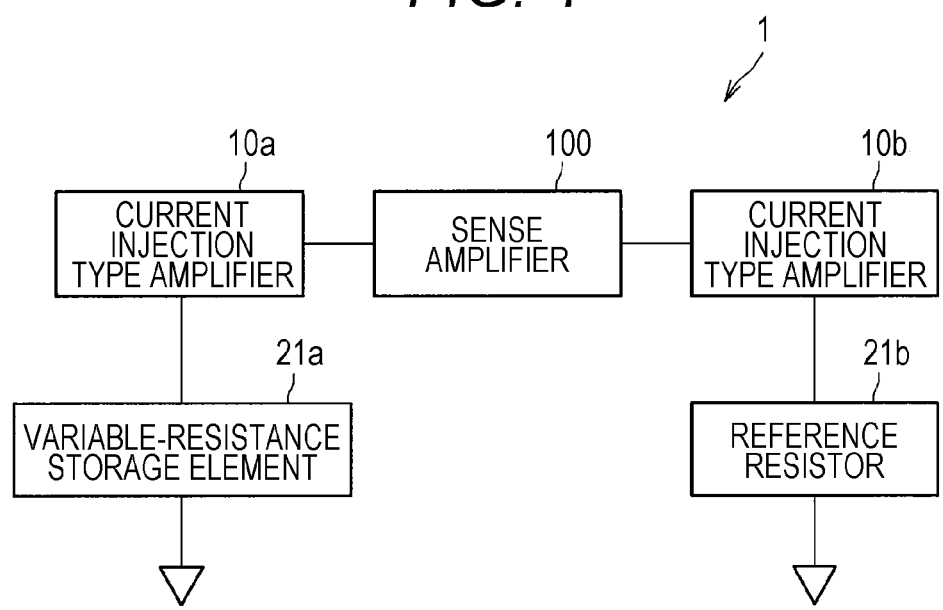
FIG. 4 is an explanatory diagram illustrating an example of a functional configuration of a semiconductor storage device according to an embodiment of the present disclosure.

FIG. 4 is an explanatory diagram illustrating an example of a functional configuration of the semiconductor storage device according to the embodiment of the present disclosure. Hereinafter, the example of the functional configuration of the semiconductor storage device according to the embodiment of the present disclosure will be described with reference to FIG. 4.

As illustrated in FIG. 4, a semiconductor storage device 1 according to the embodiment of the present disclosure includes current injection type amplifiers 10a and 10b, a variable-resistance storage element 21a, a variable-resistance storage element 21b as a reference resistor, and a sense amplifier 100.

When reading data from the variable-resistance storage element 21a, the current injection type amplifier 10a injects a current into the variable-resistance storage element 21a to amplify an output from the variable-resistance storage element 21a and outputs the amplified output to the sense amplifier 100. The current injection type amplifier 10a outputs, to the sense amplifier 100, a high-level output in a case where a resistance state of the variable-resistance storage element 21a is RH, and a low level output in a case where the resistance state of the variable-resistance storage element 21a is RL.

When reading data from the variable-resistance storage element 21a, the current injection type amplifier 10b injects a current into the variable-resistance storage element 21b to amplify an output from the variable-resistance storage element 21b and outputs the amplified output to the sense amplifier 100. In other words, the output from the variable-resistance storage element 21b is used to read the data from the storage element 20a. Configurations of the current injection type amplifiers 10a and 10b will be described later, and the current injection type amplifiers 10a and 10b are each constituted by a constant current source and a transistor for voltage clamp.

The variable-resistance storage element 21a includes at least one variable-resistance storage element which stores at least binary information on the basis of an electric resistance value. The variable-resistance storage element 21a is a storage element for data storage and the variable-resistance storage element 21b generates a potential for reference. In the present embodiment, the variable-resistance storage element 21b is formed as a combination of a storage element with a high resistance and a storage element with a low resistance. The storage element with a low resistance is a storage element in which a logical value "0" is written, and the storage element with a high resistance is a storage element in which a logical value "1" is written.

The sense amplifier 100 compares the output from the variable-resistance storage element 21a and an output from the variable-resistance storage element 21b with each other, and amplifies and outputs a comparison result. The sense amplifier 100 is activated by an activation control signal from a memory controller (not illustrated).

Figure 5:
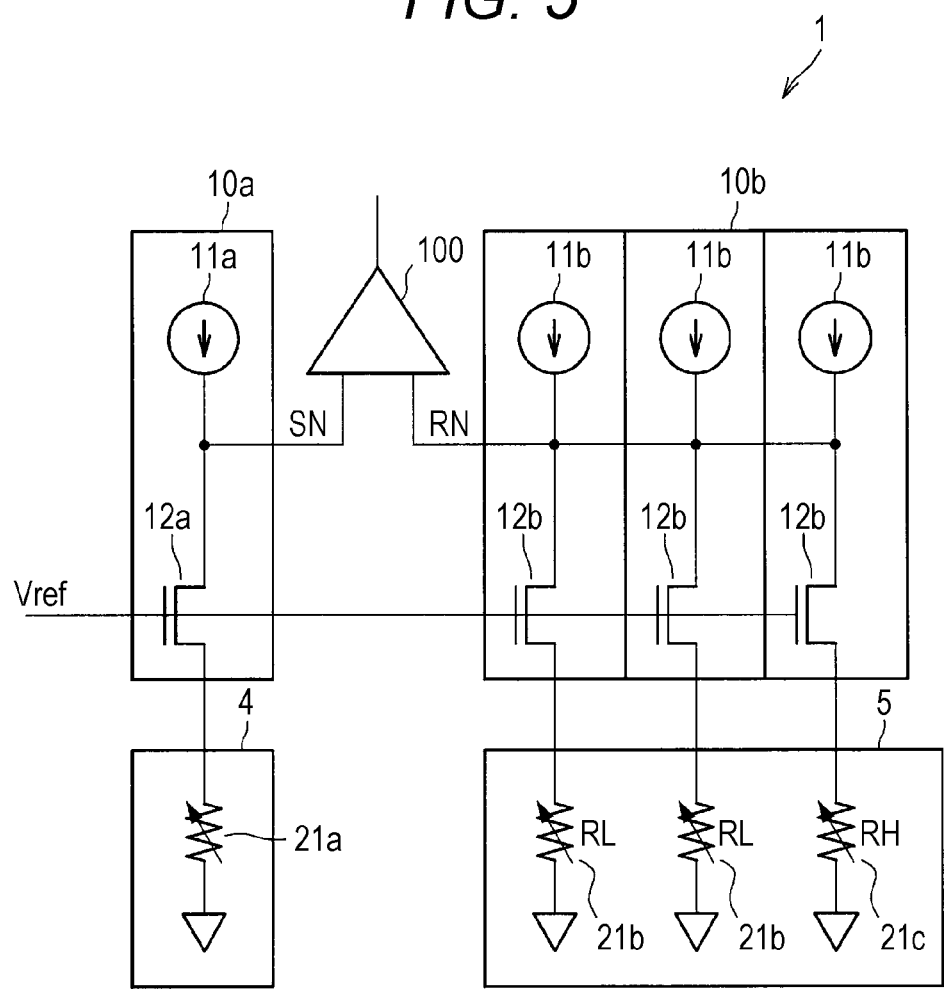
FIG. 5 is an explanatory diagram illustrating an example of a specific circuit configuration of the semiconductor storage device according to the embodiment.

Hereinabove, the example of the functional configuration of the semiconductor storage device according to the embodiment of the present disclosure has been described with reference to FIG. 4. Next, a specific example of a circuit configuration of the semiconductor storage device according to the embodiment of the present disclosure will be described. FIG. 5 is an explanatory diagram illustrating a specific example of a circuit configuration of the semiconductor storage device according to the embodiment of the present disclosure. Hereinafter, the specific example of the circuit configuration of the semiconductor storage device according to the embodiment of the present disclosure will be described with reference to FIG. 5.

The semiconductor storage device 1 illustrated in FIG. 5 includes a reading circuit 2, a reference generating circuit 3, a memory cell array 4, and a reference cell array 5.

The reading circuit 2 includes the current injection type amplifier 10a and the sense amplifier 100. The current injection type amplifier 10a includes a constant current source 11a and a transistor 12a for voltage clamp. The transistor 12a for voltage clamp is controlled by a predetermined reference voltage Vref so as to limit a voltage applied to the variable-resistance storage element 21a. Note that a plurality of reading circuits 2 can be provided.

The reference generating circuit 3 includes a plurality of current injection type amplifiers 10b. The current injection type amplifier 10b includes a constant current source 11b and a transistor 12b for voltage clamp. The transistor 12b for voltage clamp is controlled by a predetermined reference voltage Vref so as to limit a voltage applied to the variable-resistance storage elements 21b and 21c for reference.

The memory cell array 4 includes the variable-resistance storage elements 21a arranged in a matrix form. FIG. 5 illustrates a state in which only one variable-resistance storage element 21a is provided in the memory cell array 4 for convenience of explanation.

The reference cell array 5 includes the variable-resistance storage elements 21b and 21c for reference arranged in a matrix form. In the present embodiment, it is assumed that a variable-resistance storage element in a low resistance state is the variable-resistance storage element 21b and a variable-resistance storage element in a high resistance state is the variable-resistance storage element 21c. Note that the resistance state can be changed depending on a result of writing in each storage element and each storage element provided in the reference cell array 5 is not always invariably in a specific resistance state. A configuration for writing data in each storage element provided in the reference cell array 5 will be described later.

Further, the semiconductor storage device 1 according to the present embodiment includes a combination of the storage elements with RL and the storage elements with RH so that the number of storage elements with RL is larger than the number of storage elements with RH, when a plurality of storage elements for reference is provided to generate a reference potential as described above. In FIG. 5, two variable-resistance storage elements 21b and one variable-resistance storage element 21c generate the reference potential. The reference potential is generated with the combination of the storage elements with RL and the storage elements with RH, in which the number of storage elements with RL is larger than the number of storage elements with RH, such that the semiconductor storage device 1 according to the embodiment of the present disclosure can optimize the reference potential and can accurately read a resistance value of a storage element.

Figure 6:
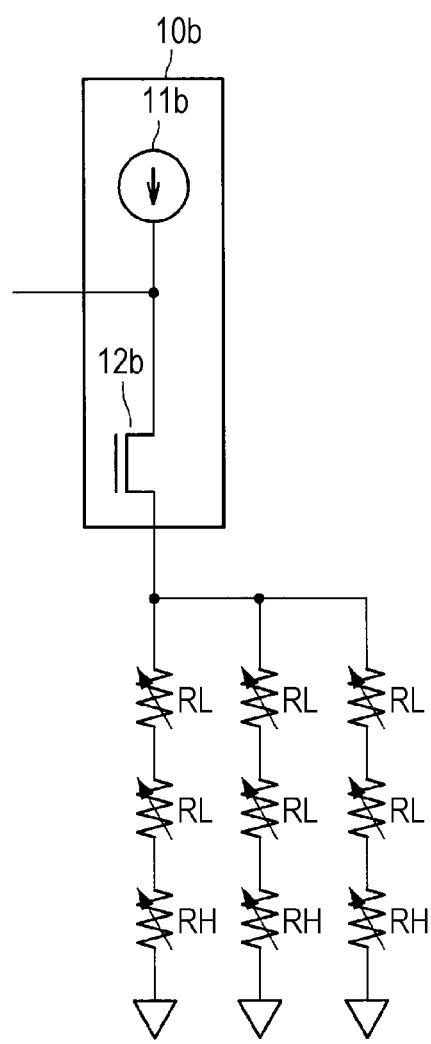
FIG. 6 is an explanatory diagram illustrating another example of a combination of storage elements for reference.

A combination of the variable-resistance storage elements 21b and 21c for reference is not limited to that illustrated in FIG. 5. FIG. 6 is an explanatory diagram illustrating another example of a combination of the variable-resistance storage elements 21b and 21c for reference in the semiconductor storage device 1 according to the present embodiment. The semiconductor storage device 1 may have, for example, a configuration in which the number of storage elements with RL is larger than the number of storage elements with RH by arranging sets in parallel as illustrated in FIG. 6, each of the sets including two variable-resistance storage elements 21b in the RL state and one variable-resistance storage element 21c in the RH state for each column.

FIG. 7 is an explanatory diagram illustrating an example of a circuit configuration of the semiconductor storage device 1 illustrated in FIG. 5, and illustrates an example of a circuit configuration of the semiconductor storage device 1 in a case where a selection transistor is provided in each storage element. As illustrated in FIG. 7, a storage element 20a may be constituted by the variable-resistance storage element 21a and a selection transistor 22a connected to the variable-resistance storage element 21a in series, a storage element 20b may be constituted by the variable-resistance storage element 21b and a selection transistor 22b connected to the variable-resistance storage element 21b in series, and a storage element 20c may be constituted by the variable-resistance storage element 21c and a selection transistor 22c connected to the variable-resistance storage element 21c in series. The selection transistors 22a, 22b, and 22c each have a gate connected to a row selection line WL, a source connected to a source line SL, and a drain connected to the variable-resistance storage element.

In the example illustrated in FIG. 7, the reference cell array 5 includes two variable-resistance storage elements 21b in the RL state and one variable-resistance storage element 21c in the RH state for each row. In other words, when a high-level potential is applied to a row selection line WL of any row and the row is selected, the semiconductor storage device 1 generates the reference potential by using the two variable-resistance storage elements 21b and the one variable-resistance storage element 21c.

Note that the reference cell array 5 may include a different combination of the variable-resistance storage element 21b and the variable-resistance storage element 21c for each row as long as a condition that the number of variable-resistance storage elements 21b is larger than that of the variable-resistance storage elements 21c. For example, the reference cell array 5 may include four variable-resistance storage elements 21b and one variable-resistance storage element 21c in any one row, and may include three variable-resistance storage element 21b and two variable-resistance storage element 21c in another row.

Figure 8A:
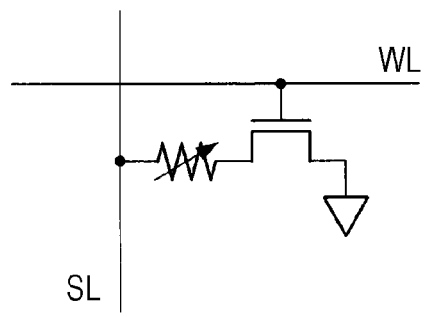
FIG. 8A is an explanatory diagram illustrating an example of a configuration of a storage element for data storage.
Figure 8B:
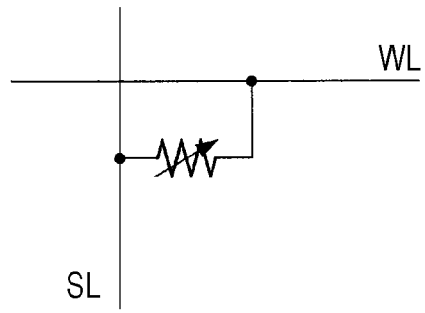
FIG. 8B is an explanatory diagram illustrating an example of a configuration of a storage element for data storage.

The storage element 20a for data storage can adopt various configurations. FIGS. 8A and 8B are explanatory diagrams illustrating examples of a configuration of the storage element 20a for data storage. The variable-resistance storage element 21a may be provided between the source line SL and the selection transistor 22a as illustrated in FIG. 8A or between the source line SL and the row selection line WL as illustrated in FIG. 8B.

The storage elements 20b and 20c for reference can adopt various configurations. FIGS. 9A to 9F are explanatory diagrams illustrating examples of a configuration of each of the storage elements 20b and 20c for reference. The storage elements 20b and 20c for reference may have a configuration of any one of FIGS. 9A to 9F, or other various configurations as long as the condition that the number of variable-resistance storage elements 21b is larger than that of the variable-resistance storage elements 21c.

Figure 9A:
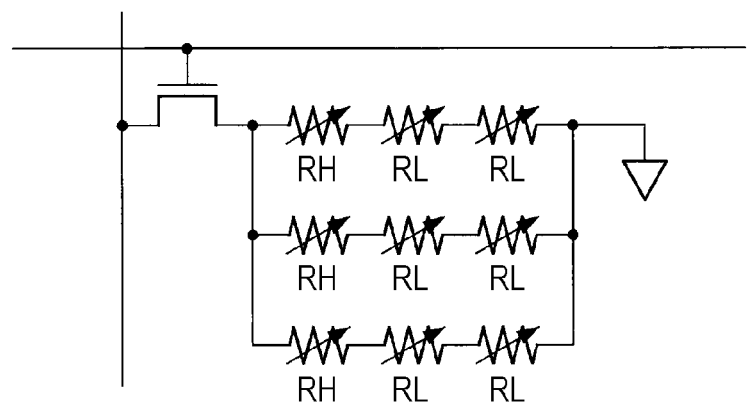
FIG. 9A is an explanatory diagram illustrating an example of a configuration of a storage element for reference.
Figure 9B:
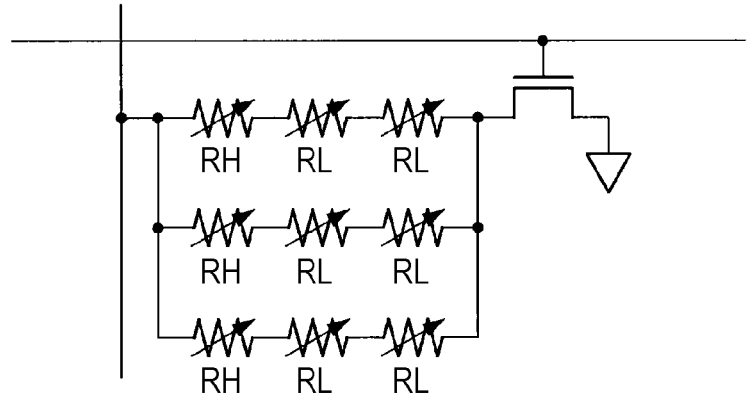
FIG. 9B is an explanatory diagram illustrating an example of a configuration of a storage element for reference.
Figure 9C:
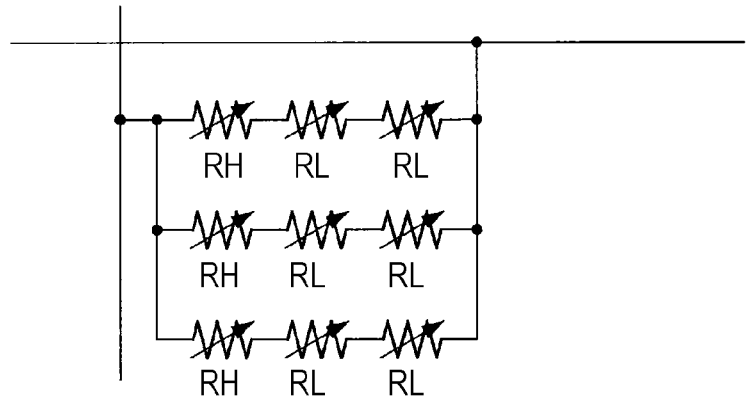
FIG. 9C is an explanatory diagram illustrating an example of a configuration of a storage element for reference.

FIGS. 9A to 9C illustrate examples of a configuration in a case where three sets of three variable-resistance storage elements connected to one another in series are arranged in parallel to one another to generate the reference potential. One of the variable-resistance storage elements connected to one another in series has a high resistance and the other two have a low resistance. Accordingly, three variable-resistance storage elements in a high resistance state and six variable-resistance storage elements in a low resistance state as a whole generate the reference potential. A difference among the configurations illustrated in FIGS. 9A to 9C is a position of the selection transistor or a presence or absence of the selection transistor.

Figure 9D:
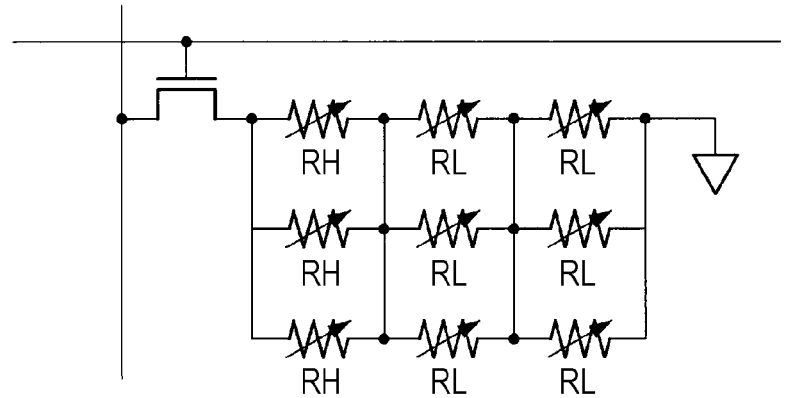
FIG. 9D is an explanatory diagram illustrating an example of a configuration of a storage element for reference.
Figure 9E:
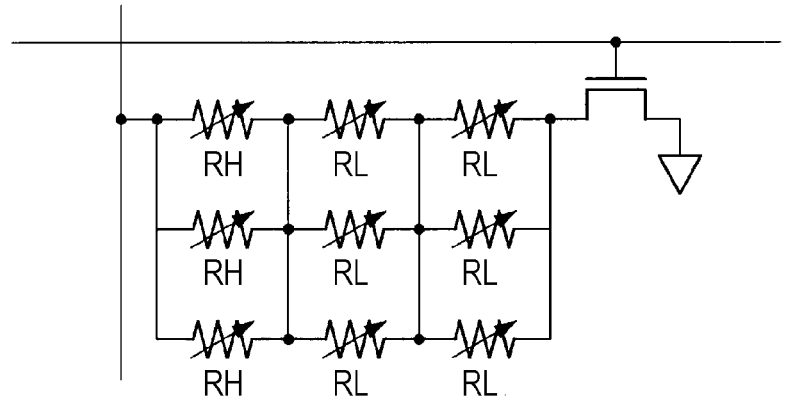
FIG. 9E is an explanatory diagram illustrating an example of a configuration of a storage element for reference.
Figure 9F:
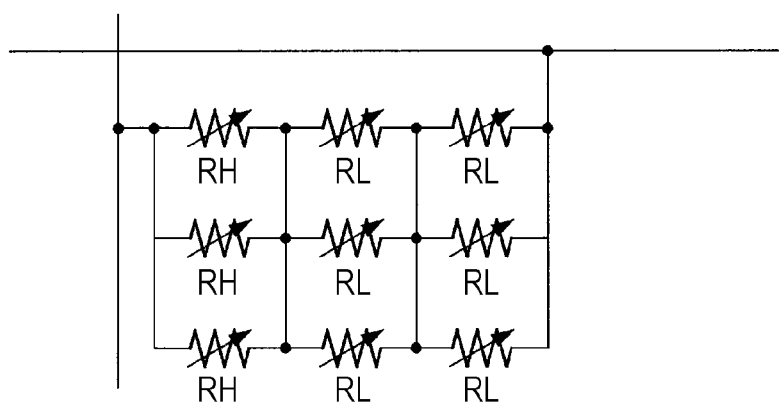
FIG. 9F is an explanatory diagram illustrating an example of a configuration of a storage element for reference.

FIGS. 9D to 9F illustrate examples of a configuration in a case where three sets of three variable-resistance storage elements connected to one another in parallel are connected to one another in series to generate the reference potential. One of the variable-resistance storage elements connected to one another in series has a high resistance and the other two have a low resistance. Accordingly, three variable-resistance storage elements in a high resistance state and six variable-resistance storage elements in a low resistance state as a whole generate the reference potential. A difference among the configurations illustrated in FIGS. 9D to 9F is a position of the selection transistor or a presence or absence of the selection transistor.

The storage elements 20b and 20c for reference of the semiconductor storage device 1 according to the present embodiment may be formed in the same array as that of the storage element 20a for data. FIG. 10 is an explanatory diagram illustrating an example of a circuit configuration of the semiconductor storage device 1 according to the present embodiment, and illustrates an example of a circuit configuration in a case where the storage elements 20b and 20c for reference are formed in the same array as that of the storage element 20a for data. The storage elements 20b and 20c for reference are formed in the same array as that of the storage element 20a for data as described above, such that it is possible to simplify a manufacturing process of the semiconductor storage device 1.

The resistance state of the variable-resistance storage element can be switched between RH and RL depending on a direction in which a voltage exceeding a threshold determined by a composition of a device is applied. Therefore, the semiconductor storage device 1 according to the present embodiment may also have a configuration in which the resistance state of the variable-resistance storage element for reference is changed by writing a value, that is, by applying a voltage.

Figure 11:
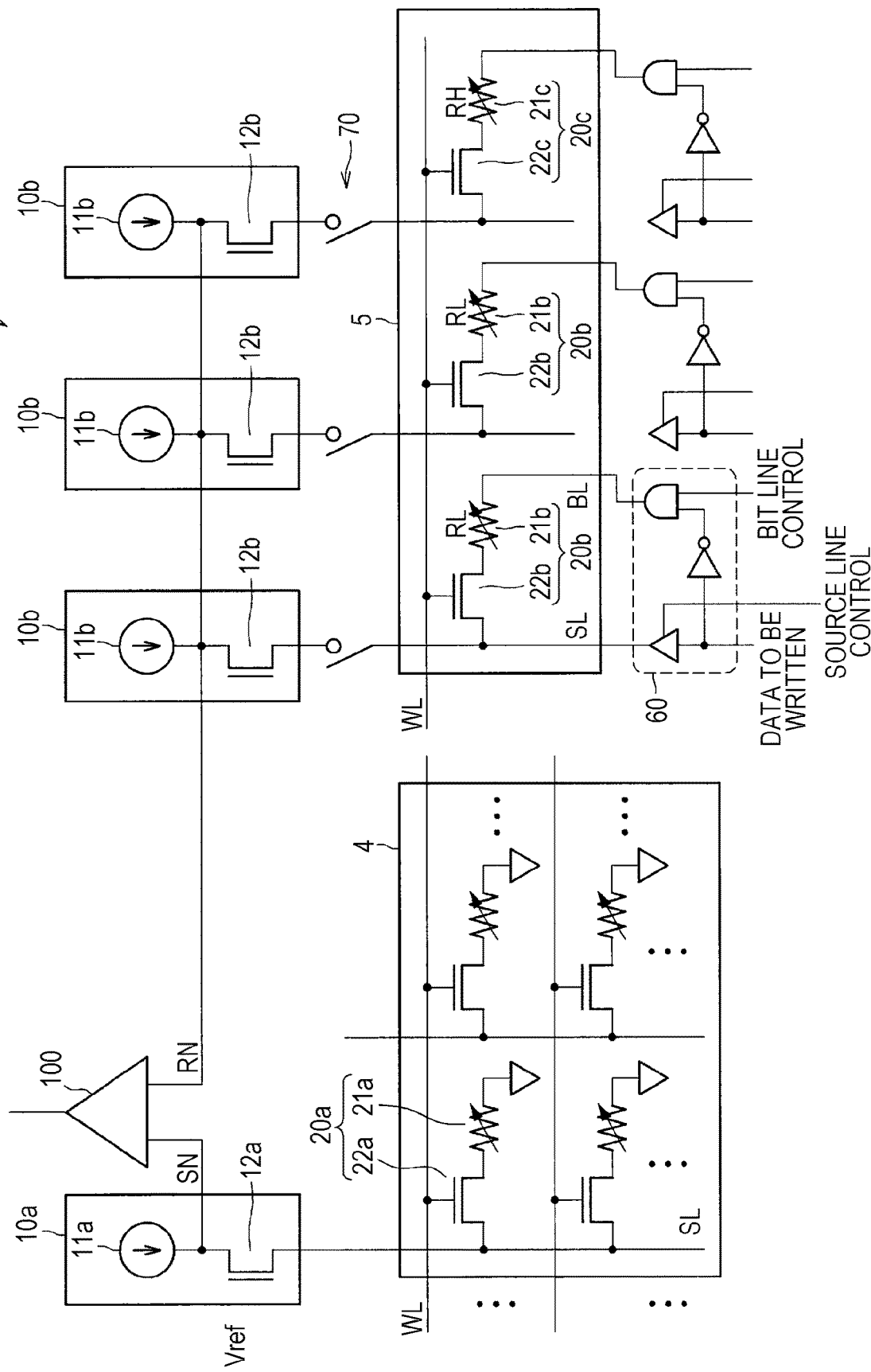
FIG. 11 is an explanatory diagram illustrating an example of a circuit configuration of the semiconductor storage device 1 according to the embodiment.

FIG. 11 is an explanatory diagram illustrating an example of a circuit configuration of the semiconductor storage device 1 according to the present embodiment. FIG. 10 illustrates the example of the circuit configuration of the semiconductor storage device 1 in a case where the configuration for writing a value in the variable-resistance storage element for reference is added to the semiconductor storage device 1 illustrated in FIG. 7. In FIG. 11, a writing circuit 60 for writing data in the variable-resistance storage element for reference is illustrated. The writing circuit 60 is a circuit for applying, to the variable-resistance storage element for reference, a predetermined potential applied from the source line SL and the bit line BL. Furthermore, in FIG. 11, a switch 70 for isolating the storage element from the current injection type amplifier 10b when writing data in the variable-resistance storage element for reference by using the writing circuit 60 is also illustrated.

The writing circuit 60 is controlled so as to be in at least three states. The three states include a state (the source line side is controlled to have a high impedance) in which the bit line BL is fixed to a ground at the time of reading, a state in which a predetermined writing voltage is applied to the source line side and the bit line is in a ground state, and a state in which a predetermined writing voltage is applied to the bit line side and the source line is in the ground state at the time of writing. At the time of writing, which state becomes a value of 1 is determined by a composition of the variable-resistance storage element.

Figure 12:
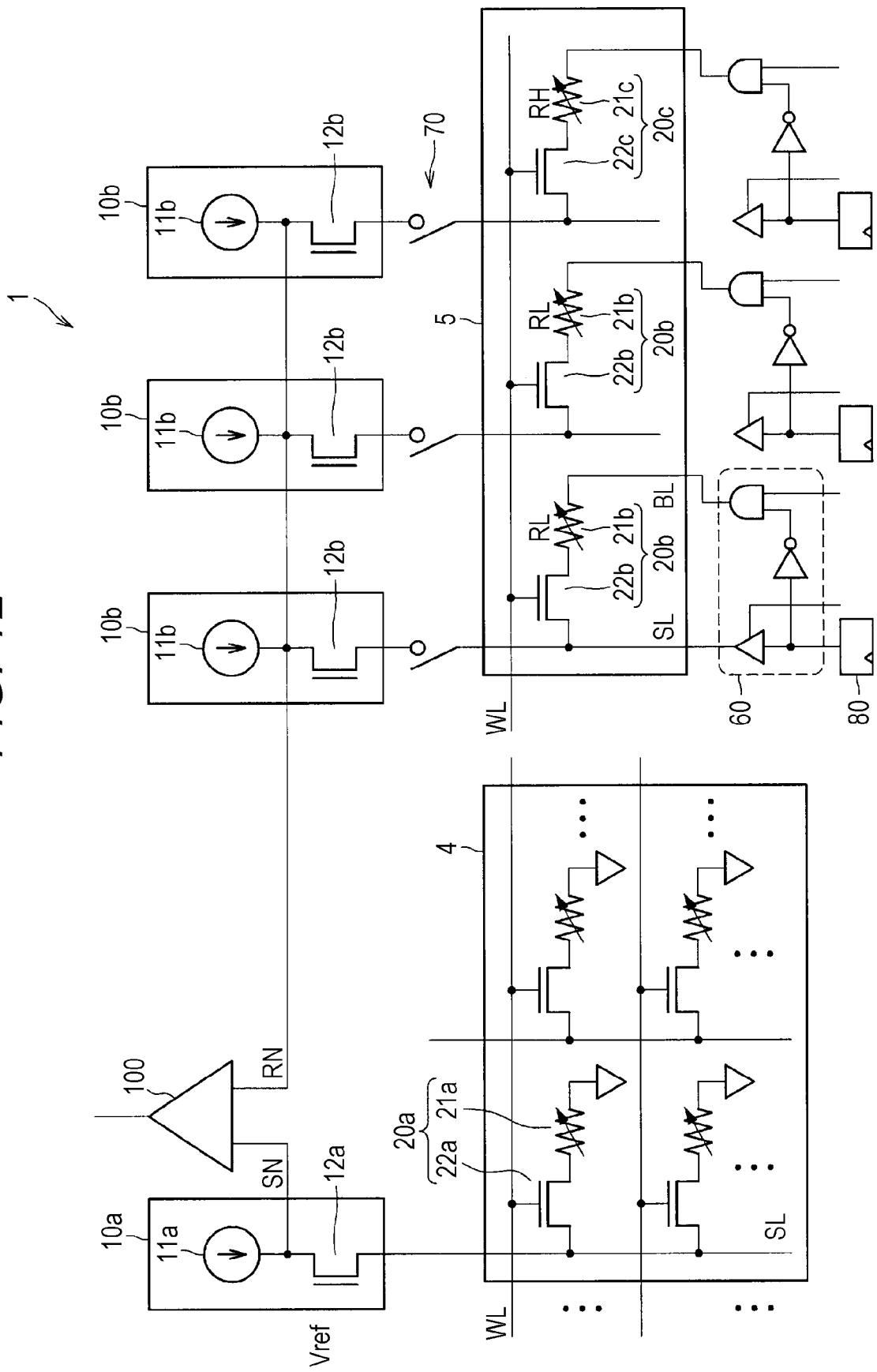
FIG. 12 is an explanatory diagram illustrating an example of a circuit configuration of the semiconductor storage device 1 according to the embodiment.

The semiconductor storage device 1 according to the present embodiment may further include a resistor for holding a value to be written in the variable-resistance storage element for reference. FIG. 12 is an explanatory diagram illustrating an example of a circuit configuration of the semiconductor storage device 1 according to the present embodiment. FIG. 12 illustrates an example of a configuration of the semiconductor storage device 1 in a case of further including a resistor 80 for writing a value in the variable-resistance storage element for reference.

Each resistor 80 is set so as to retain a state in which a logical value is 0 or 1. When writing a value in the variable-resistance storage element for reference, the value held in the resistor 80 is written in the variable-resistance storage element for reference by the writing circuit 60. Note that the value held in the resistor 80 may be able to be set from the outside of the semiconductor storage device 1.

2. Example of Application

Figure 13:
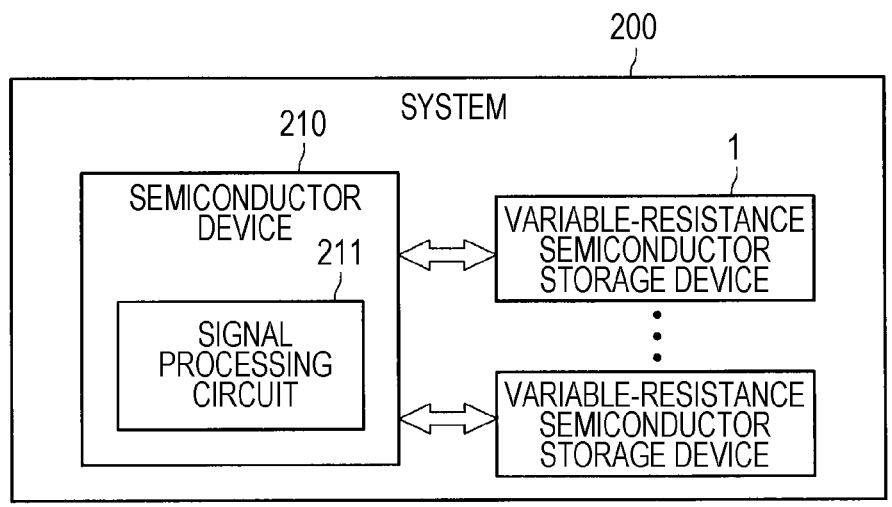
FIG. 13 is an explanatory diagram illustrating an example of a configuration of a system including the semiconductor storage device 1 according to the embodiment.
Figure 14:
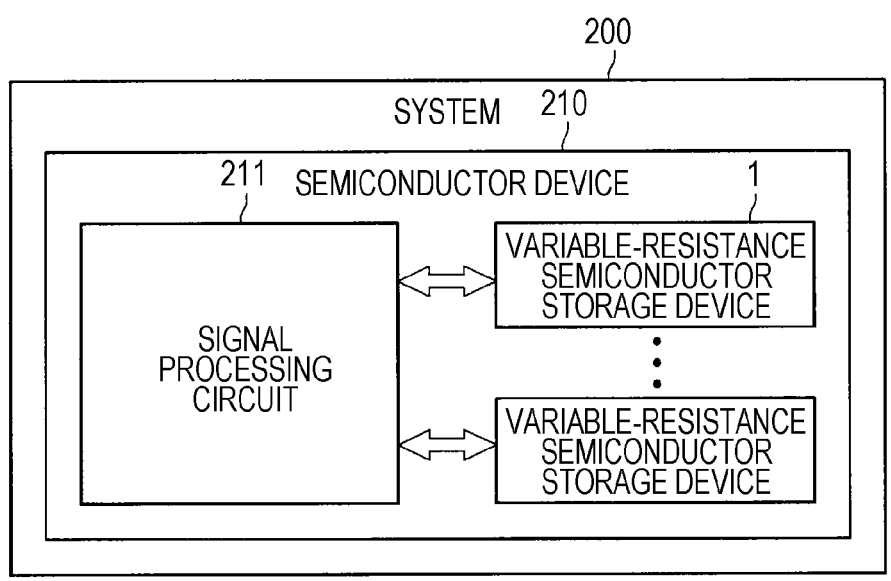
FIG. 14 is an explanatory diagram illustrating an example of a configuration of a system including the semiconductor storage device 1 according to the embodiment.

One or a plurality of semiconductor storage devices 1 according to the embodiment of the present disclosure may be incorporated into the same semiconductor device as that of a control circuit which controls the semiconductor storage device 1, or may be incorporated into a semiconductor device different from that of the control circuit which controls the semiconductor storage device 1. FIGS. 13 and 14 are explanatory diagrams illustrating examples of a configuration of a system including the semiconductor storage device 1 according to the embodiment of the present disclosure.

The example illustrated in FIG. 13 is an example in which the semiconductor storage device 1 is connected to a semiconductor device 210 including a signal processing circuit 211. The signal processing circuit 211 is a circuit which generates a signal for reading and writing data from and in the semiconductor storage device 1.

Furthermore, the example illustrated in FIG. 14 is an example in which the semiconductor storage device 1 is provided in the semiconductor device 210 including the signal processing circuit 211.

Then, the semiconductor storage device 1 according to the embodiment of the present disclosure can be mounted on various electronic devices. The electronic devices on which the semiconductor storage device 1 according to the embodiment of the present disclosure can be mounted include a smartphone, a table terminal, a digital still camera, a digital video camera, a music player, a set-top box, a computer, a television, a clock, an active speaker, a headset, a game machine, a radio, measuring instrument, an electronic tag, a beacon, and the like.

Figure 15:
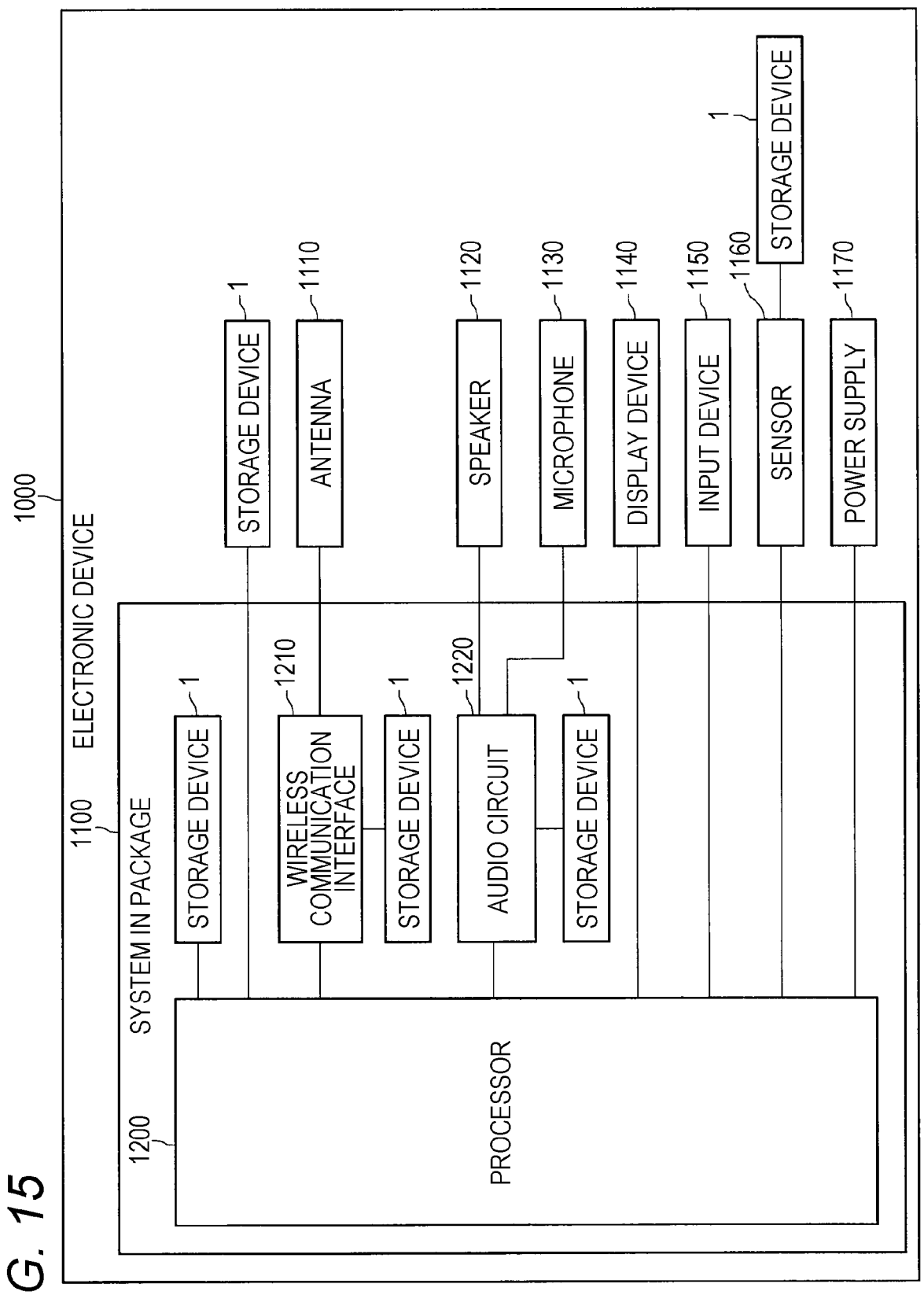
FIG. 15 is an explanatory diagram illustrating an example of a functional configuration of an electronic device 1000 on which the semiconductor storage device 1 according to the embodiment of the present disclosure can be mounted.

FIG. 15 is an explanatory diagram illustrating an example of a functional configuration of an electronic device 1000 on which the semiconductor storage device 1 according to the embodiment of the present disclosure can be mounted. The electronic device 1000 illustrated in FIG. 15 includes a system in package 1100, an antenna 1110, a speaker 1120, a microphone 1130, a display device 1140, an input device 1150, a sensor 1160, and a power supply 1170. Furthermore, the system in package 1100 includes a processor 1200, a wireless communication interface 1210, and an audio circuit 1220.

The antenna 1110 is an antenna for performing mobile communication, wireless LAN, or short-range communication, and is connected to the wireless communication interface 1210. The speaker 1120 outputs a sound and is connected to the audio circuit 1220. The microphone 1130 collects an ambient sound around the electronic device 1000 and is connected to the audio circuit 1220.

The display device 1140 is configured by, for example, a liquid crystal display, an organic EL display, a light emitting diode (LED) indicator, or the like, and is connected to the processor 1200. The input device 1150 is configured by, for example, a keyboard, a button, a touch panel, or the like, and is connected to the processor 1200.

The sensor 1160 has a function of an optical sensor, a position sensor, an acceleration sensor, a biosensor, a magnetic sensor, a mechanical sensor, a heat sensor, an electric sensor, a chemical sensor, or the like. The variable-resistance semiconductor storage device 1 according to the embodiment of the present disclosure may be connected to the sensor 1160. The power supply 1170 supplies power to the electronic device 1000, and is, for example, a power supply which supplies power from a battery, an AC adaptor, or the like.

The processor 1200 is an electronic circuit for controlling an operation of the electronic device 1000, and the variable-resistance semiconductor storage device 1 according to the embodiment of the present disclosure may be connected inside the system in package 1100 or outside the system in package 1100.

The wireless communication interface 1210 has a function such as the mobile communication, the wireless LAN, or the short range communication. The variable-resistance semiconductor storage device 1 according to the embodiment of the present disclosure may be connected to the wireless communication interface 1210. The audio circuit 1220 has a function of controlling the speaker 1120 and the microphone 1130, and the variable-resistance semiconductor storage device 1 according to the embodiment of the present disclosure may be connected to the audio circuit 1220.

The variable-resistance semiconductor storage device 1 according to the embodiment of the present disclosure is mounted on such an electronic device 1000, such that it is possible to improve reliability at the time of reading data.

3. Summary

As described above, according to the embodiment of the present disclosure, the semiconductor storage device, which can optimize the reference potential and can accurately read a resistance value of a storage element by generating the reference potential with the combination of the storage elements with RL and the storage elements with RH, in which the number of storage elements with RL is larger than the number of storage elements with RH, is provided.

The semiconductor storage device 1 according to the embodiment of the present disclosure can be a variable-resistance semiconductor storage device, for example, a spin-random access memory (spin-RAM).

Hereinabove, the preferred embodiment of the present disclosure has been described in detail with reference to the accompanying drawings, but the technical scope of the present disclosure is not limited to such examples. It is obvious that those having ordinary knowledge in the technical field of the present disclosure can conceive of various modifications or alterations within the scope of the technical idea described in the claims, and it is understood that the modifications or alterations naturally fall within the technical scope of the present disclosure.

Furthermore, the effects described in the present specification are merely illustrative or exemplary, and not limiting. That is, the technology according to the present disclosure may achieve other effects apparent to those skilled in the art from the description of the present specification, in addition to or instead of the effects described above.

Note that the following configurations also fall within the technical scope of the present disclosure.

(1)

A semiconductor storage device including:

a memory element;

a reference element in a first resistance state for generating a reference potential for identifying a value held in the memory element; and a reference element in a second resistance state in which a resistance value of the reference element is higher than that in the first resistance state for generating the reference potential, in which when generating the reference potential, the number of reference elements in the first resistance state is larger than the number of reference elements in the second resistance state.

(2)

The semiconductor storage device according to (1), further including a writing circuit configured to write a value in the reference element.

(3)

The semiconductor storage device according to (2), further including:

a current injection type amplifier configured to supply a current to the reference element to amplify an output from the memory element; and a switch configured to isolate the current injection type amplifier and the reference element from each other when the writing circuit writes the value in the reference elements.

(4)

The semiconductor storage device according to (2) or (3), in which the writing circuit writes a value for taking the first resistance state or the second resistance state in the reference element.

(5)

The semiconductor storage device according to (4), in which the writing circuit includes a resistor configured to hold the value for taking the first resistance state or the second resistance state in the reference element.

(6)

The semiconductor storage device according to any one of (1) to (5), in which the reference element includes a variable-resistance memory element.

(7)

The semiconductor storage device according to any one of (1) to (6), in which the reference element includes a variable-reluctance memory element.

(8)

An information processing apparatus including at least one semiconductor storage device according to any one of (1) to (7).

REFERENCE SIGNS LIST

1 Semiconductor storage device
2 Reading circuit
3 Reference generating circuit
4 Memory cell array
5 Reference cell array
10a Current injection type amplifier
10b Current injection type amplifier
11a Constant current source
11b Constant current source
12a Transistor for voltage clamp
12b Transistor for voltage clamp
20a Storage element
20b Storage element
20c Storage element
21a Variable-resistance storage element
21b Variable-resistance storage element
21c Variable-resistance storage element
22a Selection transistor
22b Selection transistor
22c Selection transistor
60 Writing circuit
70 Switch
80 Resistor
100 Sense amplifier
1000 Electronic device
BL Bit line
SL Source line
WL Row selection line

The invention claimed is:

1. A semiconductor storage device comprising:

a memory element; and reference elements including a first reference element and a second reference element, wherein the first reference element is configured to be placed in a first resistance state for generating a reference potential for identifying a value held in the memory element, the second reference element is configured to be placed in a second resistance state in which a resistance value of the second reference element is higher than that in the first resistance state for generating the reference potential, and when generating the reference potential, a first number of the reference elements placed in the first resistance state is larger than a second number of the reference elements placed in the second resistance state.

2. The semiconductor storage device according to claim 1, further comprising a writing circuit configured to write a value in the reference elements.

3. The semiconductor storage device according to claim 2, further comprising:

a current injection type amplifier configured to supply a current to at least one of the reference elements to amplify an output from the memory element; and a switch configured to isolate the current injection type amplifier and said at least one of the reference elements from each other when the writing circuit writes the value in the reference elements.

4. The semiconductor storage device according to claim 2, wherein the value written by the writing circuit is for placing the respective reference elements in the first resistance state or the second resistance state.

5. The semiconductor storage device according to claim 4, wherein the writing circuit includes a resistor configured to hold the value for placing the respective reference elements in the first resistance state or the second resistance state.

6. The semiconductor storage device according to claim 1, wherein the reference elements respectively include a variable-resistance memory element.

7. The semiconductor storage device according to claim 1, wherein the reference elements respectively include a variable-reluctance memory element.

8. An information processing apparatus comprising at least one semiconductor storage device according to claim 1.

9. The information processing apparatus according to claim 8, wherein the at least one semiconductor storage device includes a writing circuit configured to write a value in the reference elements.

10. The information processing apparatus according to claim 9, wherein the at least one semiconductor storage device includes:

a current injection type amplifier configured to supply a current to at least one of the reference elements to amplify an output from the memory element; and a switch configured to isolate the current injection type amplifier and said at least one of the reference elements from each other when the writing circuit writes the value in the reference elements.

11. The information processing apparatus according to claim 9, wherein the value written by the writing circuit is for placing the respective reference elements in the first resistance state or the second resistance state.

12. The information processing apparatus according to claim 11, wherein the writing circuit includes a resistor configured to hold the value for placing the respective reference elements in the first resistance state or the second resistance state.

13. The information processing apparatus according to claim 8, wherein the reference elements respectively include a variable-resistance memory element.

14. The information processing apparatus according to claim 8, wherein the reference elements respectively include a variable-reluctance memory element.

* * * * *